United States Patent [19]

Matsuura et al.

[11] Patent Number: 4,667,169
[45] Date of Patent: May 19, 1987

[54] PHASE-LOCKED LOOP FREQUENCY SYNTHESIZER HAVING REDUCED POWER CONSUMPTION

[75] Inventors: Takashi Matsuura; Yukio Fukumura, both of Tokyo, Japan

[73] Assignee: NEC Corporation, Japan

[21] Appl. No.: 883,570

[22] Filed: Jul. 10, 1986

[30] Foreign Application Priority Data

Jul. 15, 1985 [JP] Japan ................................ 60-156489

[51] Int. Cl.⁴ .............................................. H03L 7/18
[52] U.S. Cl. ........................................ 331/14; 331/16; 331/17; 331/25; 455/343
[58] Field of Search ....................... 331/14, 16, 17, 25; 455/343

[56] References Cited

U.S. PATENT DOCUMENTS 4,521,918 6/1985 Challen .............................. 331/14 X

FOREIGN PATENT DOCUMENTS

| 1591621 | 2/1971 | Fed. Rep. of Germany | 331/14 |
| 56-136037 | 10/1981 | Japan | 331/14 |
| 58-66434 | 4/1983 | Japan | 331/14 |
| 60-55729 | 4/1985 | Japan | 331/14 |

Primary Examiner—Siegfried H. Grimm
Attorney, Agent, or Firm—Ostrolenk, Faber, Gerb & Soffen

[57] ABSTRACT

In an improved phase-locked loop frequency synthesizer, a voltage is continuously applied from a power source to a fixed divider and a programmable divider respectively composed of such lower electric power consuming means as C-MOS circuitry such that the fixed and programmable dividers preserve the counting value thereof when their inputs are interrupted at the time of changing from a phase-locked loop to an open loop so that phase lock is achieved in a short time with less consumption of electric power.

3 Claims, 7 Drawing Figures

PHASE-LOCKED LOOP FREQUENCY SYNTHESIZER HAVING REDUCED POWER CONSUMPTION

FIELD OF THE INVENTION

The invention relates to a phase-locked loop frequency synthesizer, and more particularly to a phase-locked loop frequency synthesizer which is intermittently operated in phase-locked loop to result in less consumption of electric power while the pull-in time to provide a phase lock becomes shorter therein by decreasing the frequency fluctuation in the intermittent phase-locked loop operation thereof.

BACKGROUND OF THE INVENTION

In FIG. 1, there is shown one of conventional phase-locked loop frequency synthesizers which is described in Japanese patent application laid-open No. 136037/1981 published on Oct. 23, 1981. The phase-locked loop frequency synthesizer comprises an oscillator 1 for producing a reference frequency, a fixed divider 2 for dividing the reference frequency by the fixed ratio thereof, a phase detector 3 for detecting the difference of frequencies and phases between the divided frequency and an output frequency of a programmable divider 7 to be described later, a low pass filter 5 connected to phase detector 3 through an analog switch 10 to be controlled by a control signal 12 to be applied to a control signal terminal CT, a voltage-controlled oscillator (VCO) 6 for producing an output frequency proportional to the phase difference in the phase detector 3, the above mentioned programmable counter 7 for dividing the frequency produced in the VCO 6 by a dividing factor of a programmed integer, and a power source switch 11 to be controlled by the control signal 12 to connect the respective circuits to a power source PS.

In operation, when the control signal 12 is high ("1"), the analog switch 10 and the power source switch 11 are turned on at time $t_1$ in FIG. 2 so that the phase-locked loop frequency synthesizer is operated. That is to say, the phase detector 3 compares the frequency and phase of the output from the VCO 6 with those of the reference divider 2 to produce a mean DC voltage proportional to the frequency and phase differences in accordance with the comparison thereof. The mean DC voltage is fed back to a frequency varying means in the VCO 6 which decreases the frequency and phase differences by changing the frequency of the output therefrom to result in a phase-locked loop operation as illustrated by "LOCK" in FIG. 2.

On the other hand, when the control signal 12 is low ("0"), the analog switch 10 and the power source switch 11 are turned off at time $t_2$ in FIG. 2 so that the phase-locked loop frequency synthesizer is in an open loop as illustrated by "OPEN" in FIG. 2.

In the construction of a phase-locked loop frequency synthesizer mentioned above, there is provided a capacitance of a relatively large capacity at the output of the low pass filter 5 and a varactor diode to be biased reversely to result in an extremely high impedance at the input of the VCO 6.

Even in the operation of the open loop, therefore, the low pass filter 5 preserves a predetermined level of a voltage which is charged in a phase-locked loop and applies the voltage to the frequency varying means of the VCO 6. In such a condition, the voltage applied to the input of the VCO 6 is maintained to be constant for a short time. Substantially, however, the voltage is gradually decreased due to the self discharge of the capacitance of the low pass filter 5 and the leakage current flowing through the resistance of the turned-off analog switch 10 so that the output frequency of the VCO 6 is gradually decreased as illustrated by "D" in FIG. 2. In a predetermined time interval, the analog switch 10 and the power source switch 11 are turned on and off respectively at times $t_3$, $t_4$, $t_5$, and $t_6$ in FIG. 2 in accordance with the high and low of the control signal 12 in a manner mentioned above.

As clearly understood from the above descriptions, less consumption of electric power is achieved in a phase-locked loop frequency synthesizer by alternately repeating the operations of closed loop and open loop while the stability of frequency is obtained therein in a predetermined range.

According to a phase-locked loop frequency synthesizer mentioned above, however, when the analog switch 10 and the power source switch 11 are turned on to provide the phase-locked loop operation, the output frequency of the VCO 6 is fluctuated in accordance with the initial phase difference $Q_1$, $Q_2$ or $Q_3$ ($Q_2 > Q_1 > Q_3$) of the outputs between the fixed divider 2 and the programmable divider 7 as shown in FIG. 2. Therefore, longer time is necessary to result in a phase lock due to the larger frequency fluctuation if the initial phase difference is larger therein. In such a case, the larger a dividing factor M of the programmable divider 7 is, the greater the influence of the initial phase difference between the outputs of the fixed and programmable dividers is because the output frequency of the VCO 6 is varied in accordance with the phase difference to be multiplied by the dividing factor M. Therefore, the disadvantage due to the initial phase difference as described herein is inevitable even if a VCO having a higher open loop frequency stabilization is adopted therein.

SUMMARY OF THE INVENTION

Accordingly, it is an object of the invention to provide a phase-locked loop frequency synthesizer wherein less consumption of electric power is achieved.

It is a further object of the invention to provide a phase-locked loop frequency synthesizer wherein the pull-in time to result in a phase lock becomes shorter by preserving counting values of a fixed divider and a programmable divider when an analog switch is turned off to provide an open loop operation thereby suppressing the initial phase difference between the outputs from the dividers.

According to the invention, a phase-locked loop frequency synthesizer comprises an oscillator for producing a reference frequency, a fixed divider for dividing the reference frequency by a predetermined dividing ratio, a voltage-controlled oscillator (VCO) for producing a frequency proportional to a DC voltage to be input thereto, a programmable divider for dividing frequencies to be output from said VCO by a programmable dividing ratio, and a phase detector for detecting the difference of frequencies and phases in the outputs from said fixed and programmable dividers to produce said DC voltage.

In the above circuit according to the invention, there are provided first means positioned between said oscillator and said fixed divider for interrupting the input of said reference frequency to said fixed divider, and second means positioned between said VCO and said programmable divider for interrupting the input of said frequencies from said VCO to said programmable divider respectively whereby said fixed and programmable dividers preserve counting values thereof when said first and second means interrupt said inputs thereto at the time of changing from a phase-locked loop to an open loop.

In one aspect of the invention, said fixed and programmable dividers are respectively composed of such lower electric power consuming means as C-MOS to which a voltage is continuously applied from a power source in an intermittent operation of said phase-locked loop and said open loop.

BRIEF DESCRIPTION OF THE DRAWINGS

The invention will be explained in more detail in accordance with the following drawings wherein.

DESCRIPTION OF THE PREFERRED EMBODIMENT

Figure 1:
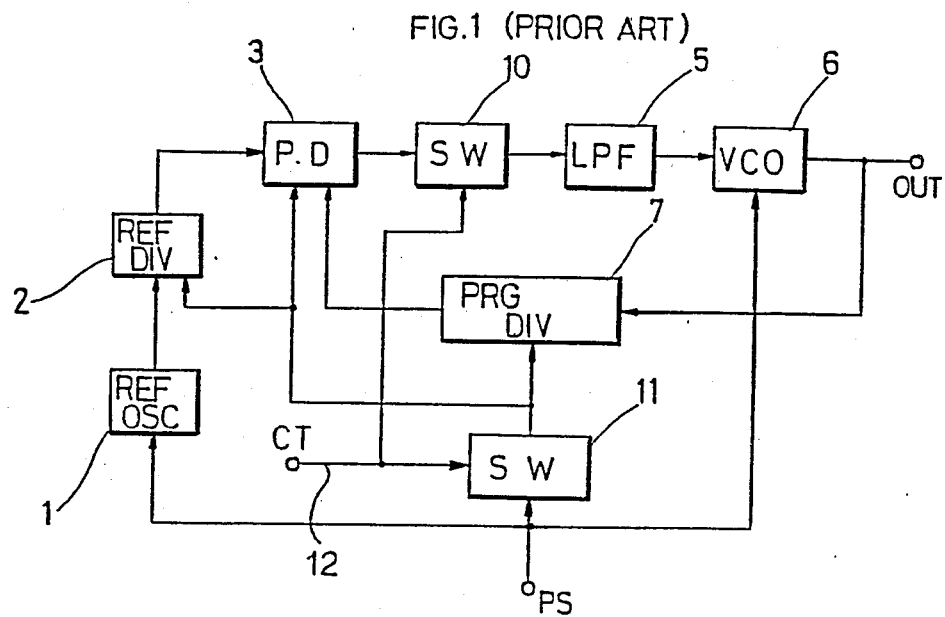
FIG. 1 is a block diagram illustrating one of conventional phase-locked loop frequency synthesizers.
Figure 2:
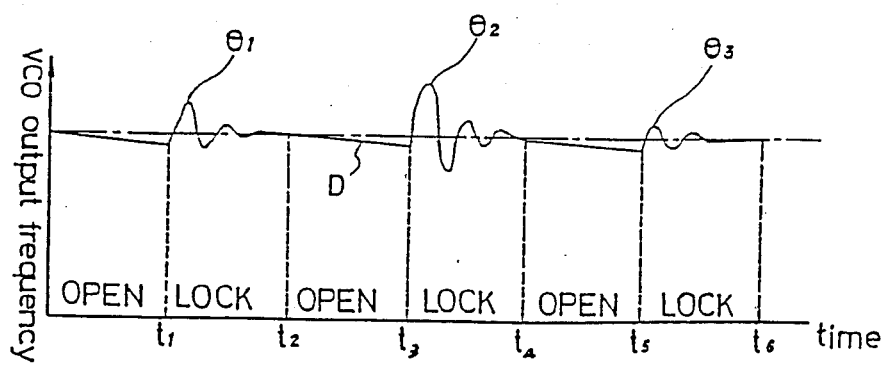
FIG. 2 is an explanatory diagram illustrating the relation between VCO output frequency and the intermittent operation of an phase-locked loop and an open loop in the conventional phase-locked loop frequency synthesizer.
Figure 3:
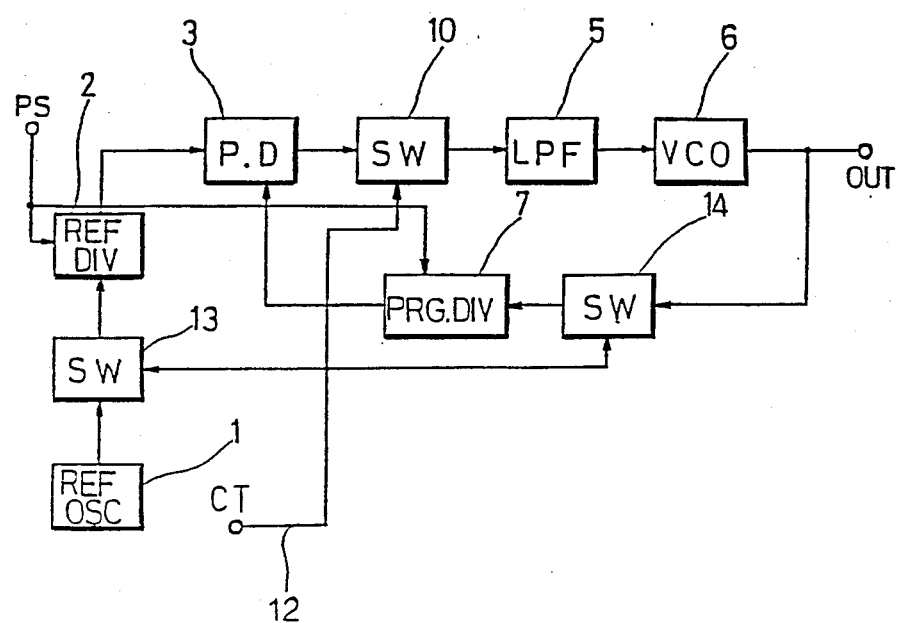
FIG. 3 is a block diagram illustrating a phase-locked loop frequency synthesizer in the first embodiment according to the invention.

In FIG. 3, there is shown a phase-locked loop frequency synthesizer in the first embodiment according to the invention which comprises an oscillator 1 for producing a reference frequency, a fixed divider 2 for dividing the reference frequency by a fixed dividing ratio, a phase detector 3 for detecting the difference of frequencies and phases between a divided frequency and an output frequency of a programmable divider to be described later, a low pass filter 5 connected to phase detector 3 through an analog switch 10 to be controlled by a control signal 12, a voltage-controlled oscillator (VCO) 6 for producing an output frequency proportional to the phase difference in the phase detector 3, the programmable counter 7 for dividing the frequency produced in the VCO 6 by a dividing factor of a programmed integer, and clock gates 13 and 14 the turning-on of which is controlled by the control signal 12.

In the construction of a phase-locked loop frequency synthesizer mentioned above, the fixed and programmable dividers 2 and 7 are of flip-flop counters each composed of complementary metal-oxide semiconductor (C-MOS) circuitry in which almost no electric power is consumed when no input is applied to each of the dividers even if the operating voltage is continuously applied from a power source PS at least to the fixed and programmable dividers 2 and 7. In addition, the clock gates 13 and 14 may be composed of, for instance, two-input NOR circuits. Moreover, the operating voltage may be constantly applied from the power source PS to the phase detector 3 if the phase detector 3 is composed of C-MOS circuit. On the other hand, the operating voltage may be applied intermittently to the phase detector 3 by turning on and off of a switch (not shown) operating synchronously with the analog switch 10 and the clock gates 13 and 14 if the phase detector 3 is not composed of C-MOS circuitry.

Figure 4A:
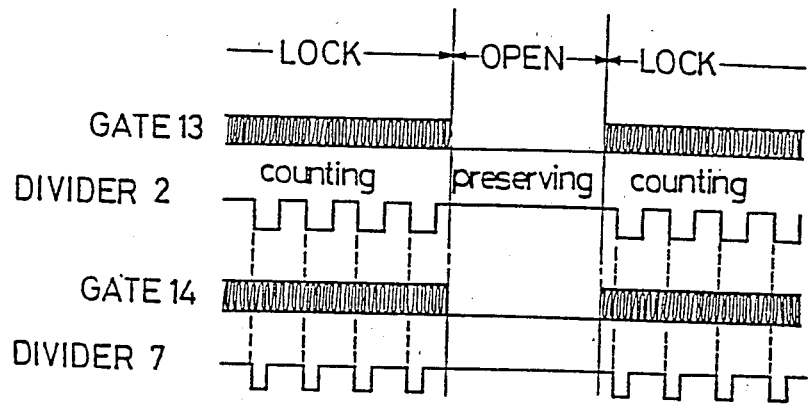
FIGS. 4A to 4C are explanatory diagrams explaining the operation of a phase-locked loop frequency synthesizer in the first embodiment according to the invention.
Figure 4B:
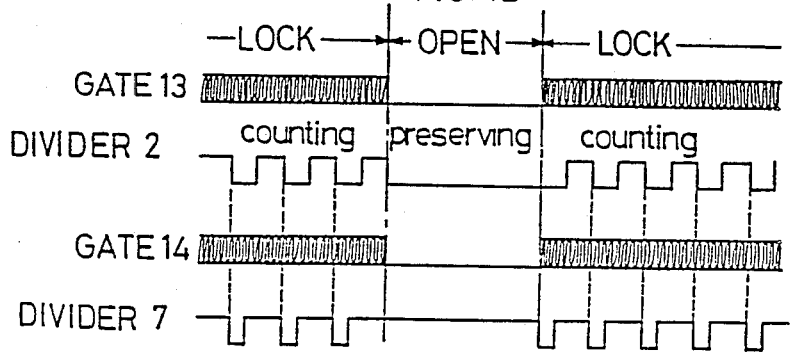
Figure 4C:
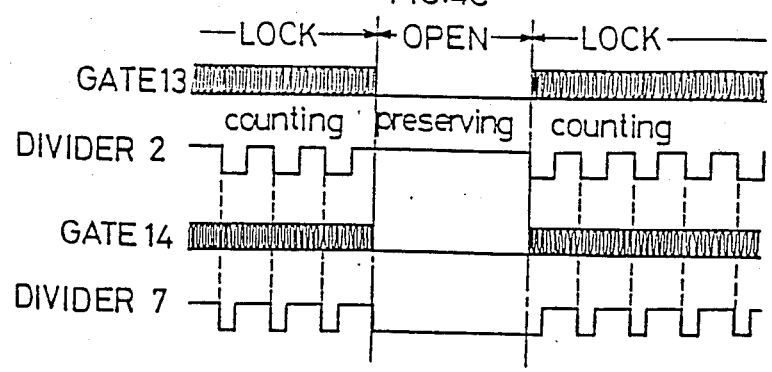

In operation, when the control signal 12 is high ("1"), the clock gates 13 and 14 and the analog switch 10 are turned on so that the phase-locked loop frequency synthesizer is operated in a phase-locked loop. On the other hand, when the control signal 12 is low ("0"), the clock gates 13 and 14 and the analog switch 10 are turned off. In such an open loop circuit, the VCO 6 is operated in accordance with the charged voltage in the low pass filter 5 to result in "free-run" due to the turning off of the analog switch 10 while the dividers 2 and 7 are interrupted to receive the inputs respectively from the oscillator 1 and the VCO 6 due to the turning off of the clock gates 13 and 14. As a result, the dividers 2 and 7 are maintained to preserve the respective count values at the time when the input signals thereto are interrupted. At this moment, there are three cases as shown in FIGS. 4A to 4C wherein the dividers 2 and 7 are still counting the respective input frequency up to a predetermined dividing value (FIG. 4A) while one of the dividers 2 and 7 finishes the frequency count equal to the dividing value (FIGS. 4B and 4C) respectively when the clock gates 13 and 14 are turned off. In the first case (FIG. 4A), there is no phase difference between the outputs of the dividers 2 and 7 when the clock gates 13 and 14 are turned on to re-start a phase-locked operation. In the second and third cases (FIGS. 4B and 4C), although there is observed the phase difference between the outputs of the dividers 2 and 7 when the clock gates 13 and 14 are turned on, the phase difference will be solved in one cycle.

As clearly understood from the descriptions of the first embodiment, a phase-locked loop frequency synthesizer according to the invention is characterized to include a fixed divider and a programmable divider each composed of C-MOS circuitry. Therefore, the leakage current becomes extremely small due to the construction of C-MOS circuitry when clock frequency is interrupted at the input to the dividers in an open loop so that less consumption of electric power is obtained to the same extent that power source is intermittently applied.

Figure 5:
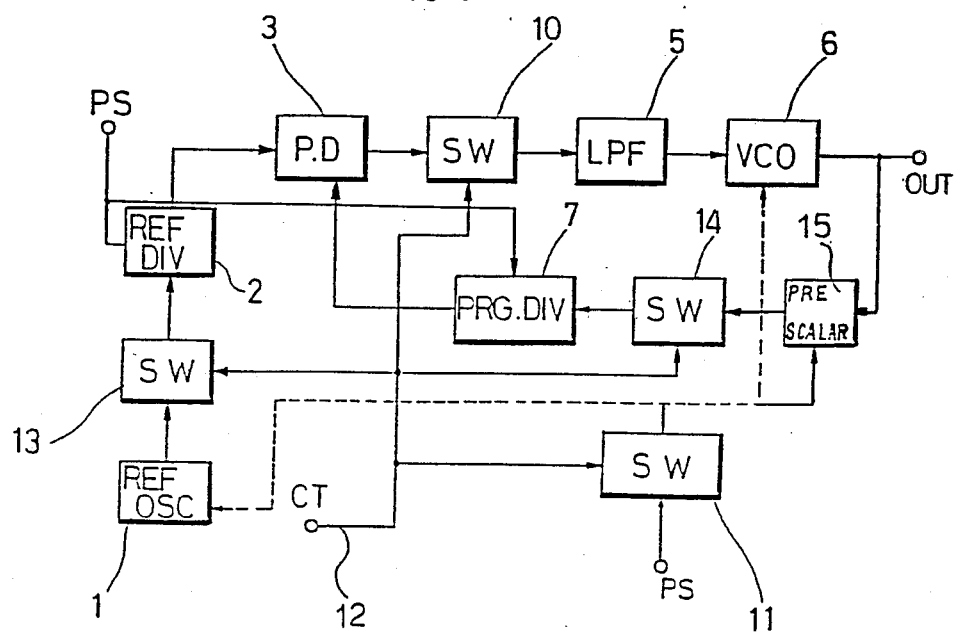
FIG. 5 is a block diagram illustrating a phase-locked loop frequency synthesizer in the second embodiment according to the invention.

In FIG. 5, there is shown a phase-locked loop frequency synthesizer in the second embodiment according to the invention wherein like references indicate like parts as described in the first embodiment thereof. It should be noted that there is a difference between the first and second embodiments in that the phase-locked loop frequency synthesizer further comprises a prescaler or mixer 15 which lowers an output frequency of the VCO 6 down to an operating frequency for the programmable divider 7. Also, a voltage from a power source PS applied to the oscillator 1, the VCO 6, and the prescaler or mixer 15 is interrupted in an open loop operation, while the voltage from power source PS is continuously applied to the fixed divider 2 and the programmable divider 7.

In operation, the fixed and programmable dividers 2 and 7 preserve the counting values thereof when the clock gates 13 and 14 are turned off so that a phase lock is achieved in a short time when a phase-locked loop operation begins in accordance with the following turning-on of the clock gates 13 and 14. In such an operation, an initial phase difference occurs between the fixed and programmable dividers 2 and 7 at the maximum range of one cycle in regard to the lower one of the two input frequencies for the dividers 2 and 7. Practically, however, such an extent of an initial phase difference is not regarded as a problem in the phase-locked loop frequency synthesizer if the two input frequencies are high to some extent.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. A phase-locked loop frequency synthesizer comprising an oscillator for producing a reference frequency, a fixed divider for dividing the reference frequency by a predetermined dividing ratio, a voltage-controlled oscillator for producing a frequency proportional to a DC voltage to be input thereto, a programmable divider for dividing frequencies to be output from said voltage-controlled oscillator by a programmed dividing ratio, a phase detector for detecting the difference of frequencies and phases in the outputs from said fixed and programmable dividers to produce said DC voltage, and means for intermittently interrupting said phase-locked loop to change it into an open loop, wherein there are provided first means positioned between said oscillator and said fixed divider for interrupting the input of said reference frequency to said fixed divider, and second means positioned between said voltage-controlled oscillator and said programmable divider for interrupting the input of said frequencies therefrom to said programmable divider respectively whereby said fixed and programmable dividers preserve counting values thereof when said first and second means interrupt said inputs thereto at the time of changing from a phase-locked loop to an open loop.

2. A phase-locked loop frequency synthesizer according to claim 1, wherein said fixed and programmable dividers are composed of lower electric power consuming means to which a voltage is continuously applied from a power source in an intermittent operation of said phase-locked loop and said open loop.

3. A phase-locked loop frequency synthesizer according to claim 2, wherein said lower electric power consuming means is composed of C-MOS circuitry.

* * * * *